(12) United States Patent
Asakura

(10) Patent No.: US 10,859,458 B2
(45) Date of Patent: Dec. 8, 2020

(54) PRESSURE SENSOR

(71) Applicant: KYOCERA Corporation, Kyoto (JP)

(72) Inventor: Yasuhiro Asakura, Kirishima (JP)

(73) Assignee: KYOCERA CORPORATION, Kyoto (JP)

(*) Notice: Subject to any disclaimer, the term of this patent is extended or adjusted under 35 U.S.C. 154(b) by 269 days.

(21) Appl. No.: 16/073,818

(22) PCT Filed: Jun. 23, 2016

(86) PCT No.: PCT/JP2016/068670
§ 371 (c)(1),
(2) Date: Jul. 30, 2018

(87) PCT Pub. No.: WO2017/141460
PCT Pub. Date: Aug. 24, 2017

(65) Prior Publication Data
US 2019/0033153 A1    Jan. 31, 2019

(30) Foreign Application Priority Data

Feb. 15, 2016    (JP) .................................. 2016-026068

(51) Int. Cl.
*G01L 9/00* (2006.01)
*G01L 9/08* (2006.01)
(Continued)

(52) U.S. Cl.
CPC .............. *G01L 9/008* (2013.01); *G01L 1/16* (2013.01); *G01L 9/08* (2013.01); *H01L 41/0471* (2013.01);
(Continued)

(58) Field of Classification Search
CPC ......... G01L 19/147; G01L 1/16; G01L 9/008; G01L 9/08; H01L 41/083; H01L 41/1132;
(Continued)

(56) References Cited

U.S. PATENT DOCUMENTS 4,838,088 A * 6/1989 Murakami ............ B81B 3/0021
361/283.4
5,062,302 A * 11/1991 Petersen ................ G01L 9/0042
338/4
(Continued)

FOREIGN PATENT DOCUMENTS

JP    52-134481 A    11/1977
JP    52134481 A  * 11/1977
(Continued)

*Primary Examiner* — John Fitzgerald
*Assistant Examiner* — Truong D Phan
(74) *Attorney, Agent, or Firm* — Volpe Koenig

(57) ABSTRACT

A pressure sensor of the present disclosure includes a laminated piezoelectric device including a stacked body in which piezoelectric layers and internal electrodes are alternately laminated; and a case which encloses the laminated piezoelectric device, the case including a case main body and a first projection protruding inwardly from the case main body, the first projection including an end face which abuts on an end face in a stacking direction of the stacked body, and is located inside an outer periphery of the end face of the stacked body.

5 Claims, 7 Drawing Sheets

(51) Int. Cl.
  *G01L 1/16* (2006.01)
  *H01L 41/083* (2006.01)
  *H01L 41/113* (2006.01)
  *G01L 19/14* (2006.01)
  *H01L 41/047* (2006.01)

(52) U.S. Cl.
  CPC ........ *H01L 41/0472* (2013.01); *H01L 41/083* (2013.01); *H01L 41/1132* (2013.01); *G01L 19/147* (2013.01)

(58) Field of Classification Search
  CPC ... H01L 41/08; H01L 41/0805; H01L 41/081; H01L 41/0815; H01L 41/0825; H01L 41/0838; H01L 41/22; H01L 41/23; H01L 41/25; H01L 41/27; H01L 41/273; H01L 41/277; H01L 41/29; H01L 41/293; H01L 41/297; H01L 41/312; H01L 41/0477; H01L 41/0471; H01L 41/0472
  USPC ............... 73/723, 1.15, 514.34, 721, 727
  See application file for complete search history.

(56) References Cited

U.S. PATENT DOCUMENTS

| | | | | |
|---|---|---|---|---|
| 6,425,294 B1* | 7/2002 | Shiono | ............... | G01L 19/0038 361/823 |
| 6,741,710 B1* | 5/2004 | Takeshima | ............... | H04R 1/06 381/190 |
| 2004/0042181 A1* | 3/2004 | Nagasaki | ............... | H01L 35/08 361/725 |
| 2005/0067707 A1* | 3/2005 | Hashimoto | ............. | H01L 24/03 257/758 |
| 2006/0179953 A1* | 8/2006 | Ueno | ................... | G01L 19/147 73/754 |
| 2010/0282874 A1* | 11/2010 | Nakamura | .......... | H01L 41/0471 239/585.1 |
| 2010/0307255 A1* | 12/2010 | Totokawa | ............. | G01L 1/2293 73/774 |
| 2012/0206544 A1* | 8/2012 | Machida | ................ | B41J 2/1628 347/68 |
| 2013/0285263 A1* | 10/2013 | Arnold | ................... | H01L 24/81 257/780 |
| 2015/0115255 A1* | 4/2015 | Sun | ....................... | C08G 69/32 257/40 |
| 2015/0120051 A1* | 4/2015 | Matsuzawa | ......... | H01L 41/1132 700/258 |
| 2015/0311012 A1* | 10/2015 | Wada | ................. | H01L 41/1132 200/514 |
| 2016/0023893 A1* | 1/2016 | Besling | .................. | H01L 29/84 257/415 |
| 2016/0086994 A1* | 3/2016 | Guenter | ............ | H01L 27/14625 250/206 |
| 2017/0033275 A1* | 2/2017 | Choi | ................... | H01L 41/0475 |
| 2017/0199217 A1* | 7/2017 | Naruse | ................. | B81B 7/0048 |
| 2019/0006623 A1* | 1/2019 | Inoue | ....................... | B32B 9/00 |

FOREIGN PATENT DOCUMENTS

| | | | |
|---|---|---|---|
| JP | 63-124636 U | | 8/1988 |
| JP | 04-105374 A | | 4/1992 |
| JP | 04105374 A | * | 4/1992 |
| JP | 2008-053315 A | | 3/2008 |
| JP | 2012-112824 A | | 6/2012 |
| JP | 2012112824 A | * | 6/2012 |
| JP | 2013-160669 A | | 8/2013 |
| JP | 2014-518383 A | | 7/2014 |
| KR | 101576444 B1 | | 12/2015 |
| WO | 2015/098724 A1 | | 7/2015 |

* cited by examiner

PRESSURE SENSOR

TECHNICAL FIELD

The present disclosure relates to a pressure sensor that utilizes a laminated piezoelectric device.

BACKGROUND ART

A device in which a piezoelectric device is housed in a case is used as a driving source for a fuel injection apparatus, as well as a pressure sensor. In the case where the device is used as the driving source, by connecting the piezoelectric device with an elongated member, such as a shaft, a great force is transmitted to the outside. On the other hand, in the case where the device is used as the pressure sensor, in order to obtain a high sensitive output by connecting a member having a small thickness, the piezoelectric device is set in a thin-walled case, with an end face of the piezoelectric device kept in contact with the inner surface of the case. As a recent design intended to achieve effective force transmission between a piezoelectric device and the exterior thereof, a part of a case which is brought into contact with a piezoelectric device is inwardly projected to increase the wall thickness of the case (refer to Patent Literature 1 and Patent Literature 2, for example).

CITATION LIST

Patent Literature

Patent Literature 1: Japanese Unexamined Patent Publication JP-A 2008-53315
Patent Literature 2: Japanese Unexamined Patent Publication JP-A 2014-518383

SUMMARY OF INVENTION

A pressure sensor according to the present disclosure comprises: a laminated piezoelectric device comprising a stacked body in which piezoelectric layers and internal electrodes are alternately laminated; and a case which encloses the laminated piezoelectric device, the case comprising a case main body and a first projection protruding inwardly from the case main body, the first projection comprising an end face which abuts on an end face in a stacking direction of the stacked body, and is located inside an outer periphery of the end face of the stacked body.

DESCRIPTION OF EMBODIMENTS

Figure 1:
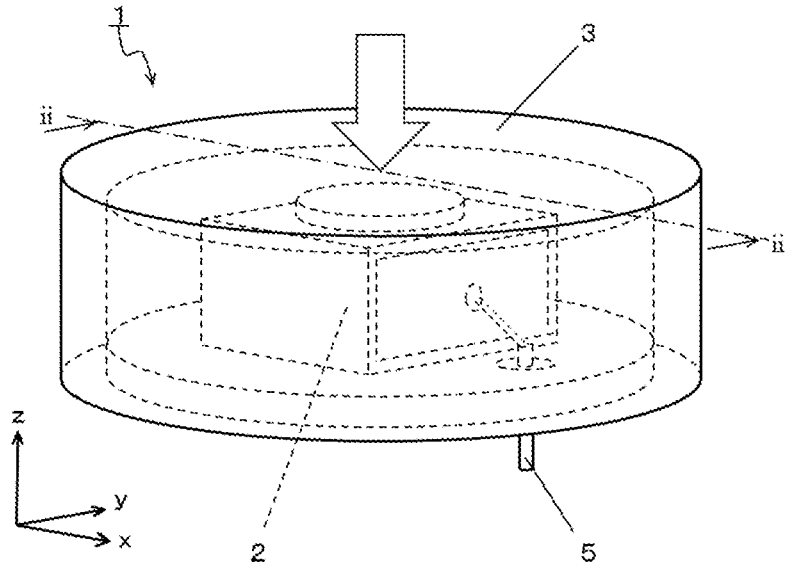
FIG. 1 is a schematic perspective view showing an embodiment of a pressure sensor.

Hereinafter, an example of a pressure sensor will be described as an embodiment with reference to the accompanying drawings. In the drawings such as FIG. 1, there is shown an x-y-z rectangular coordinate system defined specifically for a pressure sensor 1. In the following description, the definitions of directions may be based on this coordinate system. Any of the directions of the piezoelectric component 1 may be defined as either a vertical direction or a horizontal direction, and, the z-axis direction may be referred to as any of a vertical direction, a height direction, and a thickness direction. Moreover, a plan view of the pressure sensor 1 merely refers to a view of the pressure sensor 1 when seen in the z-axis direction. Note that the following embodiment is not intended to limit the invention.

The pressure sensor 1 according to the embodiment is, as in an example shown in FIGS. 1 to 3B, composed of a laminated piezoelectric device 2 comprising a stacked body 23 in which piezoelectric layers 21 and internal electrodes 22 are alternately laminated (hereafter also referred to simply as "piezoelectric device 2"), and a case 3 which encloses the laminated piezoelectric device 2. The case 3 comprises a case main body 31 and a first projection 32 protruding inwardly from the inner surface of the case main body 31. The first projection 32 has an end face 32a which abuts on an end face in a stacking direction of the stacked body 23, and is located inside an outer periphery of the end face of the stacked body 23.

Figure 2:
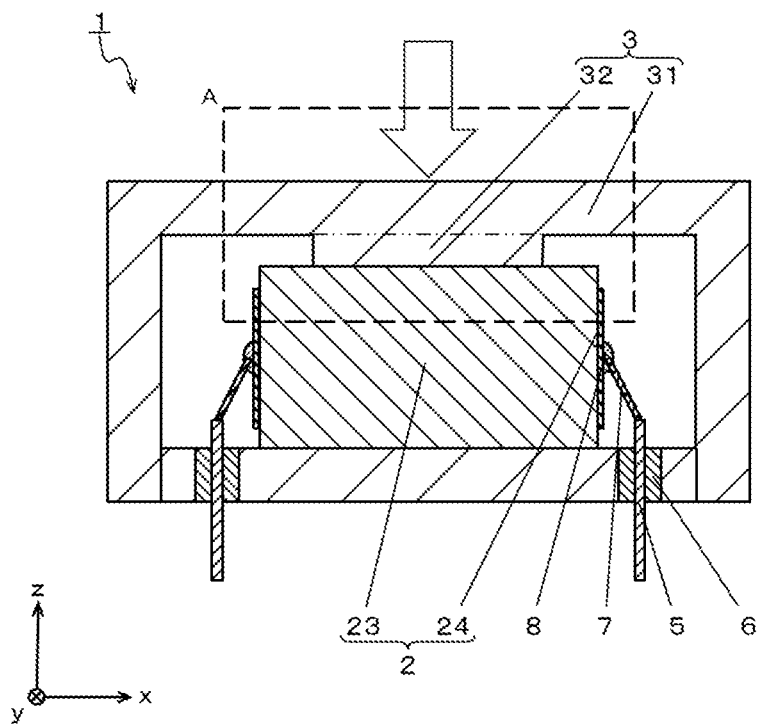
FIG. 2 is a sectional view showing a section (longitudinal section) of the pressure sensor taken along the line ii-ii shown in FIG. 1.

When the pressure sensor 1 is subjected to a pressure exerted in a direction indicated by a thick arrow in FIGS. 1 and 2, then the pressure is applied, via the case 3, to the piezoelectric device 2. The pressure sensor 1 outputs a voltage resulting from the application of the pressure to the piezoelectric layers 21 of the piezoelectric device 2, to the outside. Pressure level is calculated on the basis of the magnitude of this voltage.

In the pressure sensor 1 according to the embodiment, the laminated piezoelectric device 2 is housed in the interior space of the cylindrical case 3. In order to transmit the pressure applied to the outer surface of the case 3 to the piezoelectric device 2, the piezoelectric device 2 is housed so as to be sandwiched between the upper wall and the lower wall of the case 3. The upper outer surface of the case 3 is a surface subjected to an external force, and, on the inner surface of the case 3 opposed to the upper outer surface thereof (the ceiling of the interior space), there is provided the first projection 32, with its end face kept in contact with the upper end face of the piezoelectric device 2. The end face of the first projection 32 is a surface for transmitting an external force to the piezoelectric device 2. The piezoelectric device 2 is built as the laminated piezoelectric device 2 comprising the stacked body 23 in which the stacked piezoelectric layers 21 and internal electrodes 22 are alternately laminated, and, the end face of the first projection 32 abuts on one of the end faces (upper end face) of the stacked body 23 in the stacking direction. The other one of the end faces (lower end face) of the stacked body 23 abuts on the inner surface of the case 3 opposed to the lower outer surface thereof (the bottom of the interior space).

In the pressure sensor 1 according to the embodiment, there is provided a lead terminal 5 extending outwardly from the interior space of the case 3. The lead terminal 5 is electrically connected to the piezoelectric device 2. The voltage generated by the piezoelectric device 2 is outputted to the outside via the lead terminal 5.

Figure 3A:
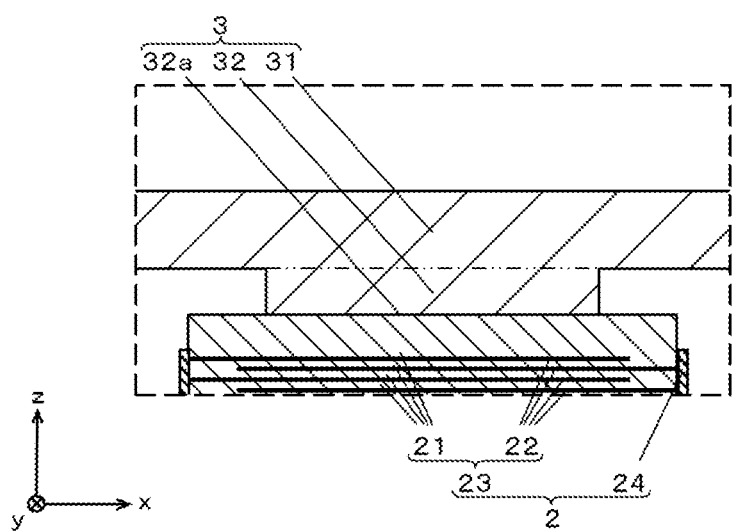
FIG. 3A is a sectional view showing a principal part (part A) of the construction shown in FIG. 2 in enlarged dimension.
Figure 3B:
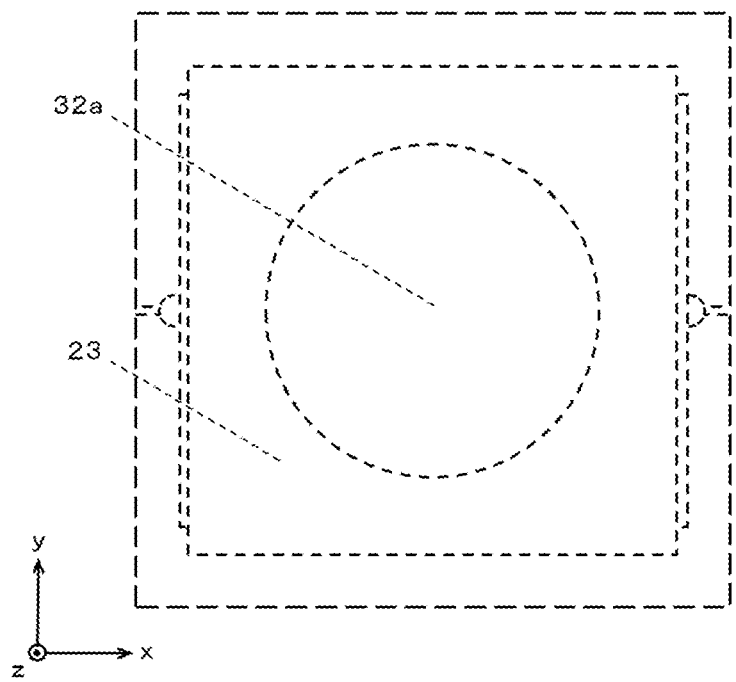
FIG. 3B is a plan view showing the plan configuration of the part shown in FIG. 3A.
Figure 4:
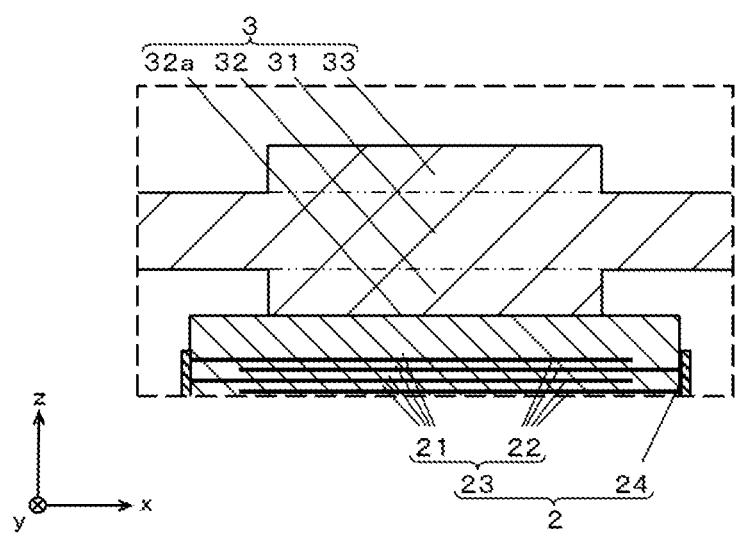
FIG. 4 is a sectional view showing a principal part of a modified example of the pressure sensor.
Figure 5A:
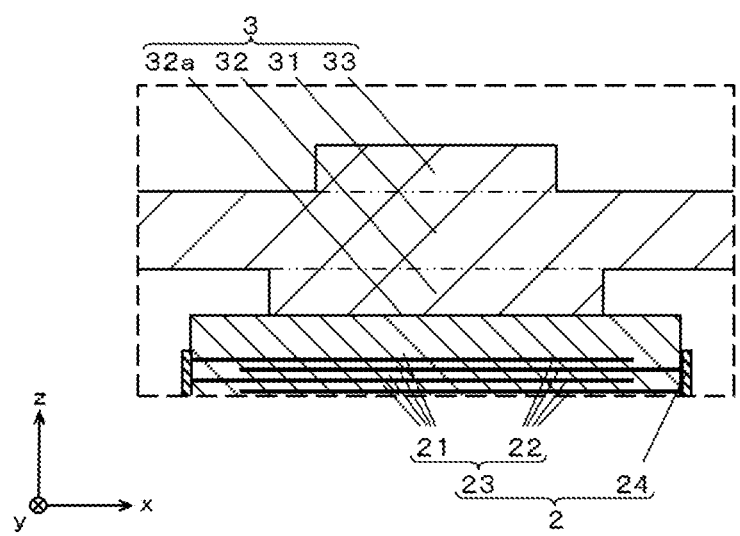
FIG. 5A is a sectional view showing a principal part of a modified example of the pressure sensor.
Figure 5B:
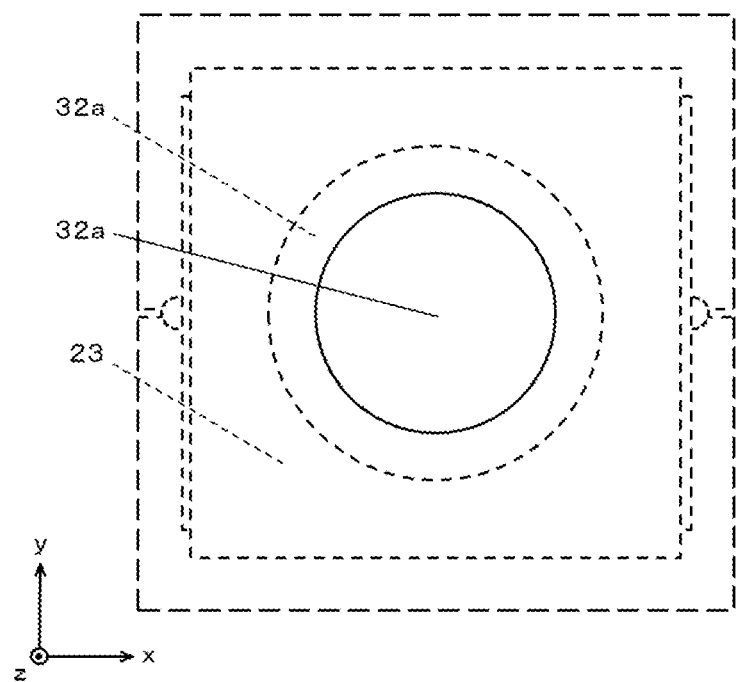
FIG. 5B is a plan view showing the plan configuration of the part shown in FIG. 5A.
Figure 6:
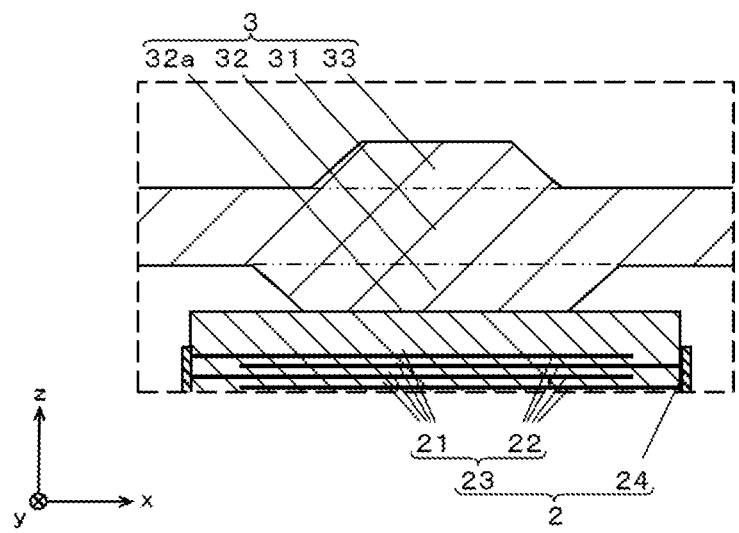
FIG. 6 is a sectional view showing a principal part of a modified example of the pressure sensor.

In this construction, the end face 32a of the first projection 32 is, as in an example shown in FIGS. 3A and 3B, located inside the outer periphery of the end face (upper end face) of the stacked body 23.

It is required that pressure sensors can be repeatedly and stably used for a long time under ever greater stress. In the conventional pressure sensor, the size of the thick-walled part of the case 3 (the end face of the first projection 32) is larger than or equal to the size of the end face of the piezoelectric device 2, and thus, the force applied to the outer surface of the case 3 may be concentrated on the outer edge of the end face of the piezoelectric device 2, or the area near a corner defined by the end face and the side face thereof. In consequence, the piezoelectric device 2 is prone to cracking, and the propagation of the resultant crack may lead to a gradual decrease in the sensitivity of the pressure sensor.

In this regard, in the pressure sensor 1 according to the embodiment, when the upper surface of the case 3 is subjected to a stress, the stress tends to be applied to the central region of the end face 32a of the piezoelectric device 2. This makes it possible to reduce the likelihood of development of a crack at the outer edge of the end face of the piezoelectric device 2.

That is, during the deformation of the upper wall (top) of the case 3 and the compression of the laminated piezoelectric device 2, the outer edge of the upper end face of the piezoelectric device 2 is clear of the end face 32a of the first projection 32, and no stress concentration is caused, and thus the outer edge of the end face of the piezoelectric device 2 is less prone to cracking. This makes it possible to avoid deterioration in sensitivity caused by crack propagation under repeated use, and thereby to obtain the pressure sensor 1 having excellent reliability.

Moreover, as in an example shown in FIGS. 4 to 7, the case 3 may comprise a second projection 33. The second projection 33 is disposed so as to face the first projection 32, with the case main body 31 located in between, and the second projection 33 protrudes outwardly from the outer surface of the case main body 31. A part of the case 3 which abuts on the piezoelectric device 2 has a larger thickness, and thus, when the pressure sensor 1 is subjected to an external force, the case main body 31 of the case 3 becomes deformed as a whole, but the end face 32a of the first projection 32 is maintained flat with little deformation. Accordingly, a partial contact of the end face 32a of the first projection 32 with the end face of the piezoelectric device 2 (stacked body 23) does not occur, and thereby a stress is evenly applied to the end face of the piezoelectric device 2, and therefore cracking is less prone to occur.

Moreover, as in an example shown in FIGS. 5A to 7, the length of the boundary between the first projection 32 and the case main body 31 as viewed in section may be different form the length of the boundary between the second projection 33 and the case main body 31 as viewed in section. As employed herein "section" refers to the section of the stacked body 23 taken in the stacking direction, or equivalently the direction of thickness of the first projection 32 and the second projection 33.

In the drawings, the boundary between the first projection 32 and the case main body 31 and the boundary between the second projection 33 and the case main body 31 are each indicated by a chain double-dashed line. In other words, the width of the case main body 31-side end (the width of the base) of the first projection 32 and that of the second projection 33 may be different from each other as viewed in section. More specifically, the outer periphery of the case main body 31-side end of the first projection 32 is not overlapped with the outer periphery of the case main body 31-side end of the second projection 33 as seen in plan perspective view. A corner defined by the side face of the first projection 32 and the inner surface of the case 3, as well as a corner defined by the side face of the second projection 33 and the outer surface of the case 3, is susceptible to the concentration of bending stress resulting from repeated application of external force. In this regard, by displacing these two corners out of alignment with respect to the case main body 31 located between the corners, as contrasted to a case where the two corners are aligned, it is possible to reduce the likelihood of development of a crack between the two corners. Thus, the pressure sensor 1, being provided with the case 3 of greater durability, exhibits higher reliability. For example, it is advisable that the outer periphery of the case main body 31-side end of the first projection 32 is offset from the outer periphery of the case main body 31-side end of the second projection 33 by an amount which is greater than or equal to the thickness of the case main body 31. Although the first projection 31 is made larger than the second projection 32 in the example shown in FIGS. 5A to 7, the design of the projections is not so limited, and contrariwise the first projection 31 may be made smaller than the second projection 32. Where the second projection 32 is made smaller than the first projection 31, the second projection 32 has a small end face which serves as an external pressure-detecting portion. This makes it possible to detect pressure in narrower regions.

Moreover, as in an example shown in FIGS. 6 to 10B, the first projection 32 may be shaped so that the case main body 31 side thereof (the inner surface side of the case 3) becomes larger gradually from the end face 32a to the inner surface of the case main body 31, and the side face of the first projection 32 is inclined with respect to the inner surface of the case main body 31. In this case, a corner defined by the end face of the first projection 32 and the side face thereof forms an obtuse angle, and thus stress concentration is reduced even if the corner abuts against the end face of the piezoelectric device 2. This makes it possible to reduce the likelihood that the stacked body 23 will suffer from a crack propagating from the area subjected to stress concentration due to the contact with the corner. Moreover, a corner defined by the side face of the first projection 32 and the inner surface of the case main body 31 forms an obtuse angle. This makes it possible to reduce the likelihood of development of a crack in the case main body 31 due to the concentration of stress on the corner resulting from repeated use of the pressure sensor 1. By the same token, as in an example shown in FIGS. 6 and 7, the second projection 33 may also be shaped so that the case main body 31 side thereof becomes larger gradually from the end face to the outer surface of the case main body 31, and the side face of the second projection 33 is inclined with respect to the outer surface of the case main body 31. For example, each of the corner defined by the end face and the side face of the first projection 32 and the corner defined by the side face of the first projection 32 and the inner surface of the case main body 31 has an angle of 105° to 150°.

Figure 7:
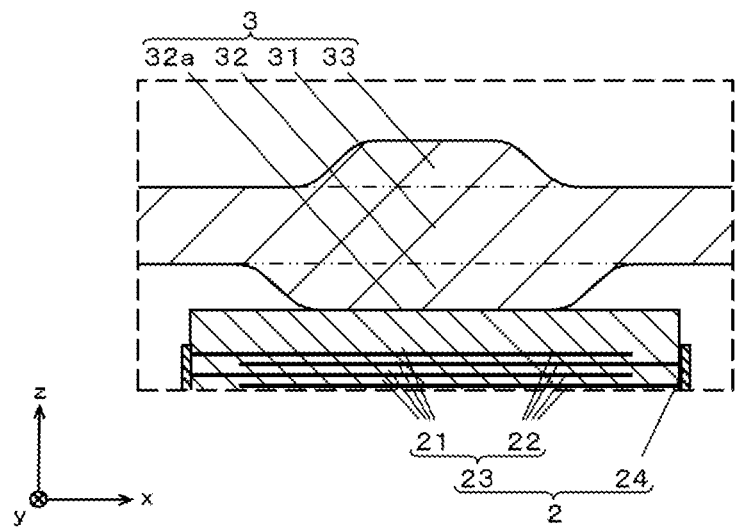
FIG. 7 is a sectional view showing a principal part of a modified example of the pressure sensor.

Moreover, as in an example shown in FIG. 7, the corner defined by the end face and the side face of the first projection 32 may be rounded to have a radiused surface. This makes it possible to further reduce the likelihood that the stacked body 23 will suffer from a crack propagating from the area subjected to stress concentration due to the contact with the corner. Likewise, the corner defined by the side face of the first projection 32 and the inner surface of the case main body 31 may be rounded to have a radiused surface. This makes it possible to further reduce the likelihood that the case main body 31 will suffer from a crack propagating from the corner. Note that, even if the side face of the first projection 32 is not inclined, the same effects can be attained by rounding off the corner defined by the end face and the side face of the first projection 32 to provide a radiused surface, as well as rounding off the corner defined by the side face of the first projection 32 and the inner surface of the case main body 31 to provide a radiused surface. In a like manner, by rounding off a corner defined by the end face of the second projection 33 and the side face thereof, it is possible to reduce the likelihood of damage to the target object under pressure measurement. Moreover, in a like manner, by rounding off a corner defined by the side face of the second projection 33 and the outer surface of the case main body 31, it is possible to further reduce the likelihood that the case main body 31 will suffer from a crack propagating from the corner.

Figure 8:
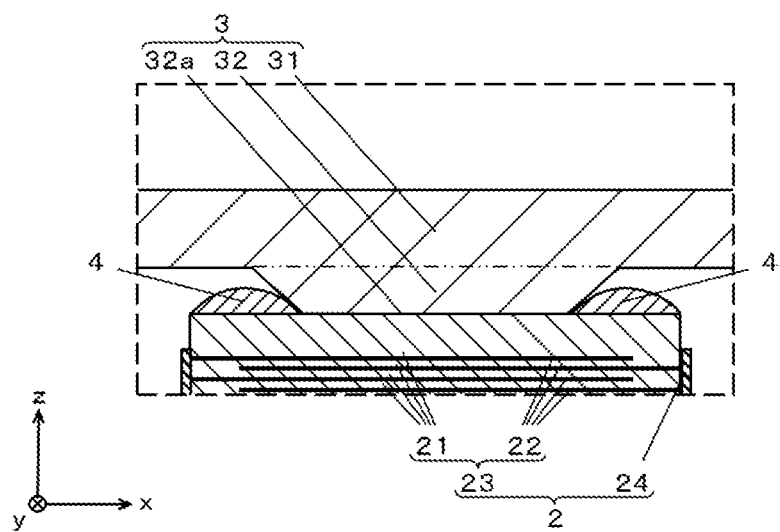
FIG. 8 is a sectional view showing a principal part of a modified example of the pressure sensor.

Moreover, as in an example shown in FIG. 8, a resin 4 may be disposed between the case main body 31 and the end face of the stacked body 23 which end face is in contact with the first projection 32 (the upper end face of the stacked body 23). More specifically, the resin 4 is disposed around the first projection 32 on the end face (upper end face) of the stacked body 23 of the piezoelectric device 2. Since the resin 4 is disposed around the first projection 32, even if the pressure sensor 1 is subjected to an external force of such magnitude as to deform the case 3 greatly, the end face 32a of the first projection 32 is restrained from changing its position. Thus, the end face 32a of the first projection 32 is restrained from abutting obliquely on the end face of the stacked body 23, and it is possible to reduce in the likelihood of development of a crack in the stacked body 23.

For example, epoxy or phenolic resin may be used as the resin 4. The resin 4 may contain a filler such as a ceramic particle or the like. The resin 4 is disposed on a region of the end face of the stacked body 23 other than the region thereof in contact with the end face 32a of the first projection 32. For example, a thickness of the resin 4 is set to 0.01 mm to 0.5 mm. By adjusting the thickness of the resin 4 to such an extent that it is clear of the inner surface of the case 3 around the first projection 32 (the case main body 31), the external force is transmitted to the end face of the stacked body 23 from the end face 32a of the first projection 32. Where the resin 4 is formed of the above-described material and the case 3 is formed of metal such as stainless steel as will hereafter be described, the softness of the resin 4 is sufficiently large compared to that of the case 3, and also, the outer edge of the end face of the stacked body 23 is not subjected to great stress. In light of this, the resin 4 may have such thickness as to make contact with the inner surface of the case 3 around the first projection 32. Moreover, the resin 4 may extend from the end face to the side face of the stacked body 23.

Figure 9A:
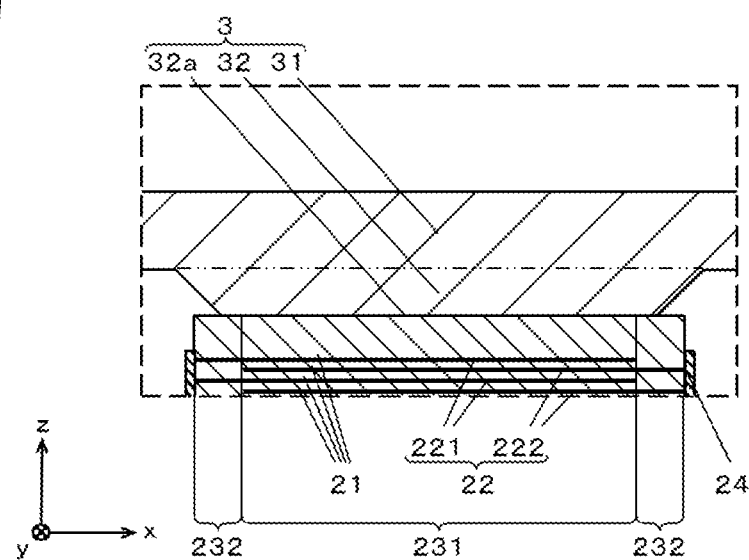
FIG. 9A is a sectional view showing a principal part of a modified example of the pressure sensor.
Figure 9B:
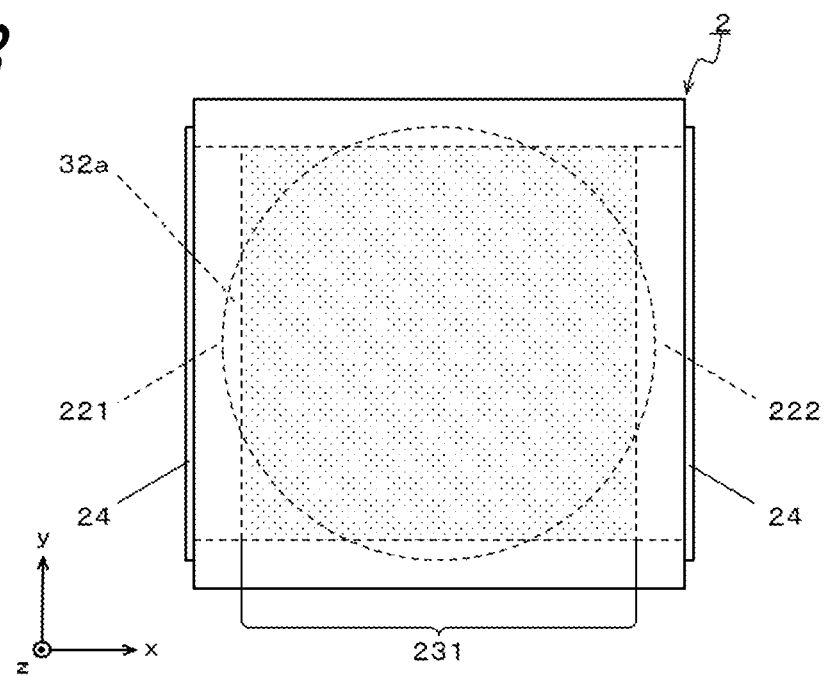
FIG. 9B is a plan view showing the plan configuration of a piezoelectric device shown in FIG. 9A.

Moreover, in the example shown in FIGS. 9A and 9B, the internal electrode 22 comprises first electrodes 221 and second electrodes 222. The stacked body 23 comprises: an active portion 231 in which the first electrodes 221 and the second electrodes 222 of the internal electrode 22 are mutually overlapped with each other in the stacking direction; and an inactive portion 232 in which the electrodes are not mutually overlapped with each other in the stacking direction. As in an example shown in FIGS. 9A and 9B, the end face 32a of the first projection 32 may be overlapped with the active portion 231, and is overlapped with part of the inactive portion 232, as viewed in the stacking direction (as seen in a plan view). With this arrangement, the corner defined by the end face 32a and the side face of the first projection 32 abuts on the inactive portion 232 of the stacked body 23. Thus, even if the pressure sensor 1 is subjected to an external force of ever greater magnitude, the starting point of the crack caused by hitting the corner of the first projection 32 is positioned in the inactive portion 232. Since a crack propagates in a direction along the side face of the stacked body 23, it is possible to reduce the likelihood of propagation of the crack through the active portion 231, and thereby reduce the likelihood of impairment of the performance capability of the piezoelectric device 2. Such advantageous effects can be ensured more reliably when the outer periphery of the end face 32a of the first projection 32 is entirely overlapped with the active portion 231 as viewed in the stacking direction. However, cracking tends to occur in a region near the side face of the stacked body 23, and it will thus be sufficient if a part of the outer periphery of the end face 32a of the first projection 32 which part is closest to the side face of the stacked body 23 (the outer periphery of the end face of the stacked body 23) is overlapped with the inactive portion 232. In the example shown in FIGS. 9A and 9B, the stacked body 23 has a square-shaped end face, and the first projection 32 has a circular end face 32a, and, only a part of the outer periphery of the end face 32a of the first projection 32 which part is close to the side of the end face of the stacked body 23 is overlapped with the inactive portion 232. In this case, there is no need for the inactive portion 232 to have unnecessarily large size, and it is thus possible to use the piezoelectric device 2 having a high proportion of the active portion, and thereby form the pressure sensor 1 as a sensor which is compact and yet operates with a high sensitivity.

Figure 10A:
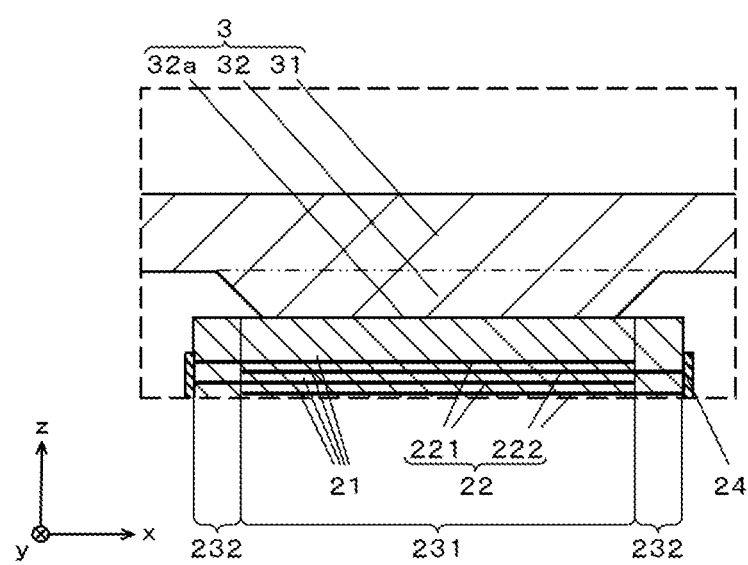
FIG. 10A is a sectional view showing a principal part of a modified example of the pressure sensor.
Figure 10B:
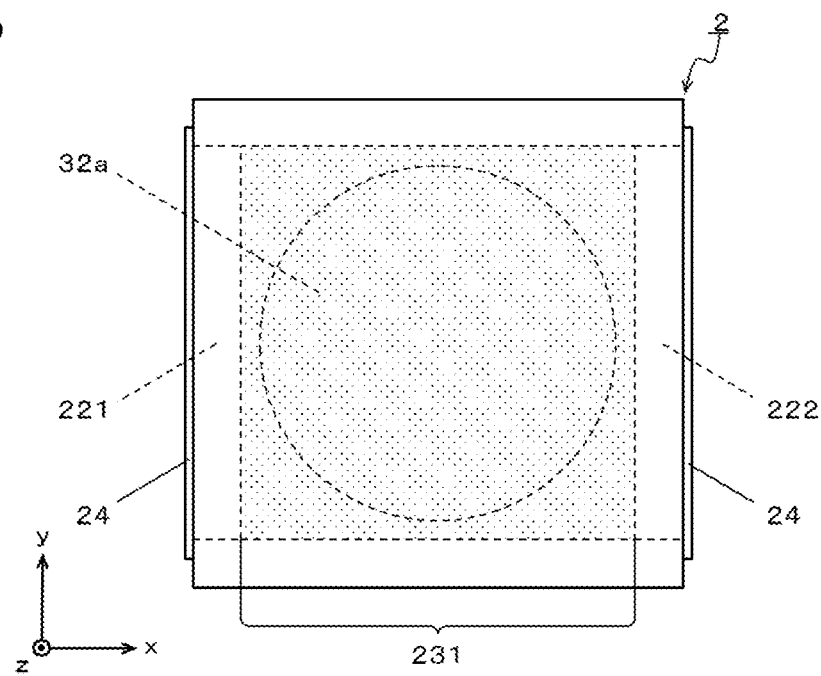
FIG. 10B is a plan view showing the plan configuration of a piezoelectric device shown in FIG. 10A.

Moreover, as in an example shown in FIGS. 10A and 10B, the end face 32a of the first projection 32 may be overlapped only with the active portion 231 as viewed in the stacking direction. In this case, the force applied to the pressure sensor 1 acts on the central area of the active portion 231 alone, and thus the pressure sensor 1 having a high sensitivity is achieved.

The laminated piezoelectric device 2 comprises the stacked body 23 in which piezoelectric layers 21 and internal electrode layers 22 are alternately laminated. For example, the stacked body 23 is shaped in a rectangular parallelepiped having a length of about 2 to 10 mm, a width of about 2 to 10 mm, and a height of about 1 to 20 mm in the stacking direction. Although the stacked body 23 shown in FIG. 1 has the shape of a quadrangular parallelepiped, for example, it may be shaped in a hexagonal or octagonal parallelepiped, or shaped in a cylindrical column.

A plurality of piezoelectric layers 21 constituting the stacked body 23 are formed of piezoelectric ceramics, and the piezoelectric ceramics is formed to have an average particle size of 1.6 to 2.8 μm, for example. As the piezoelectric ceramics, for example, it is possible to use a perovskite oxide composed of lead zirconate titanate ($PbZrO_3$—$PbTiO_3$), etc., lithium niobate ($LiNbO_3$), and lithium tantalate ($LiTaO_3$).

Moreover, the internal electrode layer 22 is predominantly composed of metal such for example as silver, a silver-palladium alloy, a silver-platinum alloy, or copper. For example, the first electrodes 221 serving as positive electrodes and the second electrodes 222 serving as negative electrodes are alternately arranged in the stacking direction. The first electrode 221 is led out to one of the side faces of the stacked body 23, whereas the second electrode 222 is led out to the other side face.

The opposite side faces of the stacked body 23, to which the first electrode 221 and the second electrode 222 of the internal electrode layer 22 are led out, respectively, are each deposited with an external electrode 24 which is joined to the led-out internal electrode layer 22. The external electrode 24 is a metallized layer composed of, for example, a sintered body of silver and glass and is electrically conducted with the internal electrode layer 22.

For example, the case 3 is made of a metal material such as stainless steel (for example, JIS-standard SUS 304 or SUS 316L). The case 3 is a container having an interior space for accommodating the piezoelectric device 2. Although the case 3 looks like a cylindrical column or a cylinder in circular plate form in the example shown in FIG. 1, the external appearance of the case 3 is not limited to this. Where the case 3 has the form of a cylinder, an upper wall (top) thereof subjected to an external force has a circular shape, and thus the upper wall undergoes uniform deformation under the external force. This is advantageous in that the end face 32a of the first projection 32 located inside the upper wall abuts on the end face of the piezoelectric device 2 without inclination. Moreover, in shaping the first projection 32, it will be sufficient if the first projection 32 has a flat end face 32a which abuts on the end face of the stacked body 23 of the piezoelectric device 2 in the stacking direction. For example, the first projection 32 is shaped in a polygonal column such as a quadrangular parallelepiped, a hexagonal parallelepiped, or an octagonal parallelepiped, or shaped in a truncated pyramid which is wider at the case main body 31-side part than at the end face 32a, or alternatively shaped in a cylindrical column or a truncated cone as in the example shown in FIG. 1. Where the case main body 31-side part of the first projection 32 has a corner-free circular shape such as the shape of a cylindrical column or a truncated cone, even if the upper wall (top) of the case 3 undergoes deformation under an external force, since the case main body 31-side end of the first projection 32 has no stress concentration-susceptible area at its outer periphery, it is possible to reduce the likelihood of propagation of a crack through the case 3. It is advisable that the second projection 33 is similar in shape to the first projection 32. For example, in respect of its exterior size, the case 3 has a diameter of 4 to 20 mm and a height of 2.5 to 25 mm, and, in respect of its interior space size, the case 3 has a diameter of 3.4 to 19.8 mm and a height of 1.3 to 24.8 mm. For example, the case main body 31 has a thickness of 0.1 mm to 1 mm. For example, the first projection 32 and the second projection 33 have an end-face diameter of 1.2 to 9.8 mm and a thickness of 0.05 to 0.5 mm. For example, the first projection 32 and the second projection 33 may be formed by metal working using a die adapted to obtain such a configuration.

In the example shown in FIGS. 1 and 2, the case 3 is composed of two portions, namely a bottom plate serving as a lower wall, and a cap-like lid portion comprising a top serving as an upper wall and a tubular part serving as a side wall, and, the side face (outer periphery) of the bottom plate and the lower end of the inner surface of the lid portion (tubular part) are welded or otherwise joined to each other. Alternatively, the outer edge of the upper surface of the bottom plate and the lower end of the lid portion may be joined to each other. The structure of the case 3 is not limited to this. Contrary to the example shown in FIGS. 1 and 2, the case 3 may be composed of two portions, namely a platy lid portion serving as an upper wall and a cupped container comprising a tubular part serving as a side wall and a bottom plate serving as a lower wall. In another alternative, the case 3 may be composed of two portions, namely a cap-like lid portion comprising a top serving as an upper wall and a tubular part serving as an upper side wall, and a cupped container comprising a tubular part serving as a lower side wall and a bottom plate serving as a lower wall. In still another alternative, the case 3 may be composed of three portions, namely a top serving as an upper wall, a tubular part serving as a side wall, and a bottom plate serving as a lower wall.

Moreover, in the example shown in FIGS. 1 and 2, the bottom plate of the case 3 has two holes formed therethrough. The lead terminal 5 is inserted into each of the two through holes, and, a space between the lead terminal 5 and the inner surface of the through hole is filled with an insulating sealing material 6 such as glass or resin, for example. The lead terminal 5 is secured to the case 3 (the bottom plate of the case 3) via the sealing material 6. An end of the lead terminal 5 located in the interior space and the external electrode 24 of the piezoelectric device 2 are electrically connected to each other via a lead wire 7 and a joining material 8 such as solder, for example. This enables a voltage signal generated in the piezoelectric device 2 to be outputted to the outside through the lead terminal 5. Although the lead terminal 5 may be joined, through the joining material 8, directly to the external electrode 24 of the piezoelectric device 2 without using the lead wire 7, by connecting the lead terminal 5 to the external electrode 24 via the lead wire 7 which is more flexible than the lead terminal 5, it is possible to reduce the stress applied to the junction between the external electrode 24 and the lead wire 7 under the expansion and contraction of the piezoelectric device 2. Moreover, the top of the case 3 may be provided with a through hole to allow the lead terminal 5 to extend outwardly from the upper surface of the case 3. In this case, a length of a part of the lead terminal 5 which part extends from the outer surface of the case 3 may be set to 1 to 10 mm, for example. As the lead terminal 5, for example, it is possible to use a metallic wire rod, such as a copper wire coated with enamel, which has a diameter of 0.1 to 1.0 mm and a length of 1.5 to 25 mm. For example, the lead wire 7 is composed of a metallic wire rod, such as a copper wire, which has a diameter of 0.1 to 1.0 mm and a length of 1.0 to 5.0 mm. The lead wire 7 is spot-welded or otherwise joined to the lead terminal 5.

REFERENCE SIGNS LIST

1: Pressure sensor
2: Laminated piezoelectric device
21: Piezoelectric layer
22: Internal electrode
221: First electrode

222: Second electrode
23: Stacked body
231: Active portion
232: Inactive portion
24: External electrode
3: Case
31: Case main body
32: First projection
32a: End face of first projection
33: Second projection
4: Resin
5: Lead terminal
6: Sealing material
7: Lead wire
8: Joining material

The invention claimed is:

1. A pressure sensor, comprising:
a laminated piezoelectric device comprising a stacked body in which piezoelectric layers and internal electrodes are alternately laminated; and
a case which encloses the laminated piezoelectric device, the case comprising a case main body and a first projection protruding inwardly from the case main body,
the first projection comprising an end face which abuts on an end face in a stacking direction of the stacked body, and is located inside an outer periphery of the end face of the stacked body,
wherein the internal electrodes comprise a first electrode and a second electrode,
the stacked body comprises an active portion in which the first electrode and the second electrode are mutually overlapped with each other in the stacking direction; and an inactive portion in which the first electrode and the second electrode are not mutually overlapped with each other in the stacking direction, and
the end face of the first projection is overlapped with the active portion, and is overlapped with only a portion but not an entirety of the inactive portion, as viewed in the stacking direction.

2. The pressure sensor according to claim 1, wherein a corner defined by the end face of the first projection and a side face of the first projection is rounded to have a radiused surface.

3. The pressure sensor according to claim 1, wherein a resin is disposed between the case main body and the end face of the stacked body that is in contact with the end face of the first projection.

4. The pressure sensor according to claim 1, wherein the case comprises a second projection which is disposed so as to face the first projection, with the case main body located in between, and protrudes outwardly from the case main body.

5. The pressure sensor according to claim 4, wherein a length of a boundary between the first projection and the case main body as viewed in a section of the pressure sensor differs from a length of a boundary between the second projection and the case main body as viewed in a section of the pressure sensor.

* * * * *